United States Patent
Maeda et al.

(10) Patent No.: US 8,673,685 B1
(45) Date of Patent: Mar. 18, 2014

(54) ELECTRONIC COMPONENT MOUNTING LINE AND ELECTRONIC COMPONENT MOUNTING METHOD

(71) Applicant: Panasonic Corporation, Osaka (JP)

(72) Inventors: Tadashi Maeda, Yamanashi (JP); Hiroki Maruo, Osaka (JP); Tsubasa Saeki, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/981,871

(22) PCT Filed: Oct. 19, 2012

(86) PCT No.: PCT/JP2012/006721
§ 371 (c)(1),
(2), (4) Date: Jul. 25, 2013

(87) PCT Pub. No.: WO2013/094098
PCT Pub. Date: Jun. 27, 2013

(30) Foreign Application Priority Data

Dec. 22, 2011 (JP) ................................. 2011-282124

(51) Int. Cl.
*H01L 21/44* (2006.01)
*H01R 43/00* (2006.01)

(52) U.S. Cl.
USPC .............................. 438/108; 438/118; 29/854

(58) Field of Classification Search
USPC .......... 438/107, 108, 109, 118, 119, 124–127; 29/854, 855, 856
See application file for complete search history.

(56) References Cited

U.S. PATENT DOCUMENTS 6,558,978 B1 * 5/2003 McCormick .................. 438/108
6,757,966 B2 * 7/2004 Inoue et al. ..................... 29/840
2005/0161492 A1 7/2005 Yamamoto
2009/0099678 A1 4/2009 Kurata et al.
2010/0000773 A1 1/2010 Yoshinaga et al.
2010/0152877 A1 6/2010 Maenishi
2010/0264196 A1 10/2010 Inaba et al.

FOREIGN PATENT DOCUMENTS

| EP | 1890212 A1 | 2/2008 |
| EP | 2064930 A2 | 6/2009 |
| JP | 2003-273165 A | 9/2003 |

(Continued)

OTHER PUBLICATIONS

International Search Report issued in International Patent Application No. PCT/JP2012/006721 mailed on Nov. 20, 2012.

*Primary Examiner* — Kevin M Picardat
(74) *Attorney, Agent, or Firm* — McDermott Will & Emery LLP

(57) ABSTRACT

Disclosed is an electronic component mounting line on which a substrate undergoes solder paste printing, electronic component placements, and then reflow, while being moved from upstream to downstream. The line includes: a substrate feeding machine; a printing machine for applying solder paste to a first placement area of the substrate; a first electronic component placement machine for placing a first electronic component on the first placement area; a second electronic component placement machine for dispensing a thermosetting resin onto a reinforcement position on a peripheral edge portion of a second placement area of the substrate, and for placing on the area the second electronic component having solder bumps; and a reflow machine for bonding the electronic components to the substrate, by heating and cooling the resultant. The second electronic component is placed after the resin is dispensed, such that a peripheral edge portion thereof comes in contact with the resin.

8 Claims, 8 Drawing Sheets

(56) References Cited

FOREIGN PATENT DOCUMENTS

| | | |
|---|---|---|
| JP | 2005-026648 A | 1/2005 |
| JP | 2007-018505 A | 1/2007 |
| JP | 2007-129132 A | 5/2007 |
| JP | 2007-266330 A | 10/2007 |
| JP | 2008-078431 A | 4/2008 |
| JP | 2009-038340 A | 2/2009 |
| JP | 2010-251579 A | 11/2010 |
| WO | WO-2006-132282 A1 | 12/2006 |
| WO | WO-2008-035819 A2 | 3/2008 |
| WO | WO-2008/142864 A1 | 11/2008 |

\* cited by examiner (a)

(b)

ELECTRONIC COMPONENT MOUNTING LINE AND ELECTRONIC COMPONENT MOUNTING METHOD

RELATED APPLICATIONS

This application is the U.S. National Phase under 35 U.S.C. §371 of International Application No. PCT/JP2012/006721, filed on Oct. 19, 2012, which in turn claims the benefit of Japanese Application No. 2011-282124, filed on Dec. 22, 2011, the disclosures of which Applications are incorporated by reference herein.

TECHNICAL FIELD

The present invention relates to an electronic component mounting line for mounting on a substrate, small electronic components such as chip components and electronic components such as chip-scale packages.

BACKGROUND ART

Electronic components such as integrated circuits, resistors, and capacitors are mounted on printed circuit boards. With electronic components made more compact in recent years, electronic components mounted on one printed circuit board are increasing in number and kind. Due to demands for downsized electronic components, chip scale packages (CSPs) are placed on substrates.

A CSP has a main surface on which terminals are arranged in a regular array, and a solder bump is formed on each of these terminals. For a CSP to be surface mounted on a printed circuit board, the solder bumps formed on the terminals are made to land on electrodes called lands on the printed circuit board. This is followed by heating, reflowing, and cooling in this order, thereby creating an interconnection between the CSP and the printed circuit board. This enables the terminals on the CSP to be electrically connected to the lands on the printed circuit board, and to be bonded to the printed circuit board due to the solder.

When thermal stress generated by thermal cycles, or external force, is applied to a CSP that is surface mounted on a printed circuit board, the portion of the CSP bonded to the printed circuit board may lack sufficient strength if it is only due to solder. Moreover, connection only due to solder lacks sufficient strength against impact caused by dropping. Therefore, reinforcing resin is used to reinforce the solder-bonded portion of the CSP.

One method of reinforcing the solder-bonded portion by using reinforcing resin, is to allow an underfill material to enter the interstices between the main surface of the CSP with the solder bumps thereon and the printed circuit board. Moreover, Patent Literature 1 proposes a method of providing reinforcing resin on a printed circuit board in advance before placing thereon an electronic component such as a CSP, only at positions (reinforcement positions) which correspond to those on a peripheral edge portion of the electronic component. This method is much better compared to using an underfill material, in terms of facilitating repair work on electronic components.

In addition to CSPs, the following are usually mounted on printed circuit boards: electronic chip components mounted by using solder paste, such as chip resistors and chip capacitors; and components with lead-wires such as connectors. Moreover, the facility used for mounting of such electronic components on printed circuit boards, is an electronic component mounting line which comprises in the given order: a screen printing machine for printing solder paste; an adhesive dispensing machine for dispensing an adhesive for temporary bonding; an electronic component placement machine (first electronic component placement machine) for placing small electronic chip components; an electronic component placement machine (second electronic component placement machine) for placing large electronic components including CSPs, and other kinds of electronic components such as connectors; and a reflow machine for melting solder. The accomplished configuration of such an electronic component mounting line has a history of over 20 years, and is capable of performing in one continuous flow, processes which involve: placement of electronic components of sizes ranging from miniscule to large, up to 30 millimeters square; and reflow of the resultant assembly.

PRIOR ART

Patent Literature

[Patent Literature 1] Japan Laid-Open Patent Publication No. 2008-78431

SUMMARY OF INVENTION

Technical Problem

Usually, the following steps of (1) to (5) are performed in the given order, when a conventional electronic component mounting line is utilized for mounting on one printed circuit board, CSPs through solder bump bonding and other components through solder paste bonding: (1) a printed circuit board is conveyed on the line to a screen printing machine, and this machine screen prints solder paste onto the printed circuit board at positions where electronic components are to be mounted; (2) an adhesive dispensing machine dispenses an adhesive serving as reinforcing resin, on the printed circuit board, specifically at a position corresponding to that of a peripheral edge portion of the CSP; (3) an electronic component placement machine places on the printed circuit board, the electronic components to be mounted by using solder paste; (4) another electronic component placement machine places CSPs, etc. on the printed circuit board; and then (5) the resultant assembly is reflowed.

However, a conventional electronic component mounting line can cause the following problem.

As illustrated in FIG. 10(a), the reinforcing resin 105 in the step (2) needs to be dispensed on the printed circuit board 101 at a reinforcement position 104 arranged close to a land 102b, with its height adjusted for contact with the CSP 210 that would later be placed on the printed circuit board 101 in the step (4). That is, the reinforcing resin 105 is adjusted in height so that it reaches an inner substrate 211 of the CSP 210, when the CSP 210 is placed on the printed circuit board 101.

Here, when the step (3) of placing the electronic components to be mounted by using solder paste comes between the steps (2) and (4), idle time is created between the steps (2) and (4), and the reinforcing resin may flow out in a planar direction during this interval. As a result, the reinforcing resin may come in contact with the solder paste that has been placed and printed on the land in the step (1), and this may cause reduced reactivity of the solder paste. Thus, there is a possibility of poor bonding due to insufficient melting of the solder during reflow, and due to insufficient wetting by and spreading of the solder. Moreover, when the reinforcing resin gradually loses its shape over time and its height becomes too low, as illustrated in FIG. 10(b), the reinforcing resin cannot come in contact with the CSP 210 when the CSP 210 is placed on the substrate. Thus, there are instances where the initial aim of reinforcement cannot be achieved.

The present invention aims to provide an electronic component mounting line and an electronic component mounting method, both capable of preventing the foregoing problem, specifically, poor quality of mounting of electronic components on a substrate due to reinforcing resin gradually flowing over time.

Solution to Problem

An electronic component mounting line of the present invention enables a substrate to undergo solder paste printing, electronic component placements, and reflow in this order, while being moved from upstream to downstream, the line comprising:

a substrate feeding machine for feeding the substrate having a first placement area for placement of a first electronic component with a solder paste between the area and the component, and a second placement area for placement of a second electronic component having solder bumps;

a screen printing machine for applying the solder paste to the first placement area of the substrate that has been fed by the substrate feeding machine;

a first electronic component placement machine for placing the first electronic component on the first placement area of the substrate to which the solder paste has been applied;

a second electronic component placement machine comprising: a dispensing head for dispensing a thermosetting resin onto at least one reinforcement position arranged on a peripheral edge portion of the second placement area of the substrate; and a placing head for placing the second electronic component on the second placement area of the substrate; and a reflow machine for bonding the first and second electronic components to the substrate, by heating the substrate on which the first and second electronic components have been placed, to melt the solder paste and the solder bumps and to cure the thermosetting resin; and then cooling the substrate, the second electronic component placement machine, after dispensing the thermosetting resin onto the reinforcement position, places the second electronic component such that a peripheral edge portion of the second electronic component comes in contact with the thermosetting resin that has been dispensed onto the reinforcement position.

Moreover, an electronic component mounting method of the present invention enables a first electronic component and a second electronic component to be mounted on a substrate that is being moved from upstream to downstream on an electronic component mounting line, the first electronic component having connection terminals for solder paste connection, the second component having solder bumps, the method comprising:

a first step of preparing the substrate including: a first placement area having first electrodes for connection to the connection terminals; and a second placement area having second electrodes for connection to the solder bumps;

a second step of applying a solder paste to the first electrodes, by using a screen printing machine arranged on the electronic component mounting line;

a third step of placing the first electronic component on the substrate such that the connection terminals land on the solder paste on the corresponding first electrodes;

a fourth step of dispensing a thermosetting resin onto at least one reinforcement position arranged on a peripheral edge portion of the second placement area;

a fifth step of placing the second electronic component on the substrate such that the solder bumps land on the corresponding second electrodes; and bringing the thermosetting resin that has been applied to the reinforcement position, in contact with a peripheral edge portion of the second electronic component; and a sixth step of bonding the first and second electronic components to the substrate by heating the substrate on which the first and second electronic components have been placed, to melt the solder paste and the solder bumps and to cure the thermosetting resin, by using a reflow machine arranged on the electronic component mounting line; and then cooling the substrate, the third step being performed by a first electronic component placement machine arranged on the electronic component mounting line; and the fourth and fifth steps being performed in recited order, by a second electronic component placement machine comprising a dispensing head for dispensing the thermosetting resin and a placing head for placing the second electronic component.

Advantageous Effects of Invention

According to the electronic component mounting line and the electronic component mounting method of the present invention, the second electronic component placement machine performs the step of dispensing the thermosetting resin onto the reinforcement position, and then, the step of placing the second electronic component. Therefore, the second electronic component is placed on the substrate after the thermosetting resin is dispensed onto the reinforcement position, without idle time in between the two steps. This results in preventing poor bonding caused by the thermosetting resin, provided as a reinforcing resin, losing its shape over time and consequently spreading out or deforming.

While the novel features of the invention are set forth particularly in the appended claims, the invention, both as to organization and content, will be better understood and appreciated, along with other objects and features thereof, from the following detailed description taken in conjunction with the drawings.

DESCRIPTION OF EMBODIMENTS

First, a description will be given on a first electronic component, a second electronic component, and a substrate which constitute a substrate with electronic components mounted thereon that is produced by utilizing an electronic component mounting line of the present invention.

Figure 1:
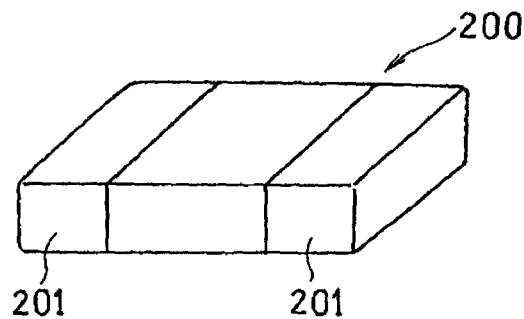
FIG. 1 is an oblique view of a first electronic component which is a chip component.

FIG. 1 is an oblique view of an example of a first electronic component 200. The first electronic component 200 has at least one connection terminal 201 bonded thereto with a solder paste. Examples of electronic components that are bonded with solder paste include: chip components as exemplified by 0402 size and 1005 size chips; and components with lead-wires such as transistors, etc. Moreover, even in the case of components with bumps, they are classified as the first electronic component if they are mounted by using solder paste and do not require reinforcement using reinforcing resin, or application (transfer) of flux to the bumps.

Figure 2A:
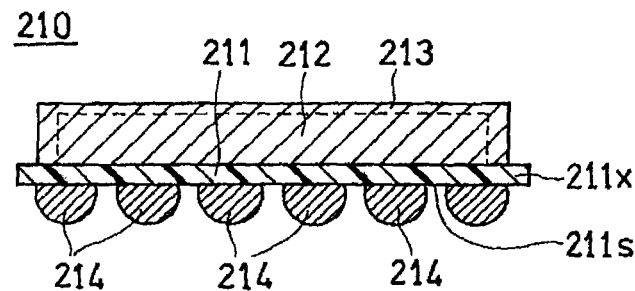
FIG. 2A is a vertical sectional view of a second electronic component having solder bumps.
Figure 2B:
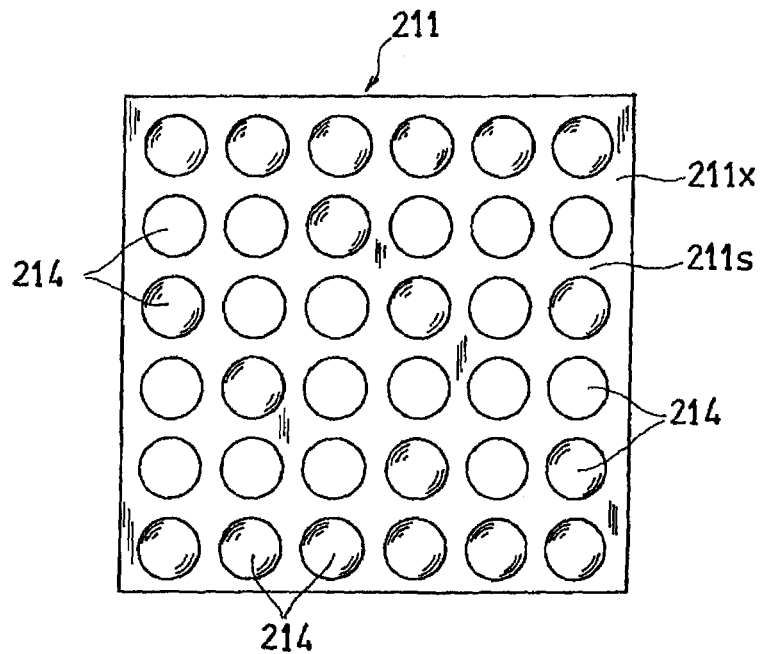
FIG. 2B is a bottom view of the second electronic component of FIG. 2A.

FIG. 2A is a vertical sectional view of an example of a second electronic component 210, and FIG. 2B is a bottom view thereof. The second electronic component 210 is a CSP comprising: a thin inner substrate 211; and a semiconductor device 212 mounted on the upper surface thereof and encapsulated with a resin sealant 213. The lower surface of the inner substrate 211 corresponds to a main surface 211s of the second electronic component 210; the main surface 211s has thereon terminals arranged in a regular array; and the terminals have thereon solder bumps 214, respectively. The second electronic component requires reinforcement using reinforcing resin; and therefore, before the second electronic component is placed on a substrate, flux is applied (transferred) to the solder bumps 214.

Figure 3:
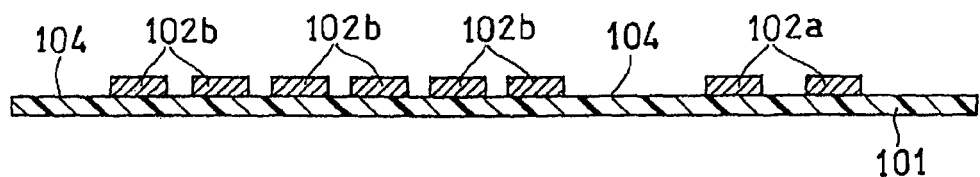
FIG. 3 is a vertical sectional view of an example of a substrate before the electronic component is placed thereon.

As illustrated in FIG. 3, the substrate 101 comprises: a first placement area and a second placement area. The first placement area has thereon first electrodes 102a for connection to the connection terminals 201 of the first electronic component 200. The second placement area has thereon second electrodes 102b for connection to the solder bumps 214, respectively, of the second electronic component 210. Arranged on a peripheral edge portion of the second placement area corresponding to a peripheral edge portion of the second electronic component 210, is at least one reinforcement position 104 for application of reinforcing resin, that is, of thermosetting resin, thereto.

On the substrate 101, usually two or more of the reinforcement positions 104 are arranged on the peripheral edge portion of the second placement area having the second electrodes 102b thereon. Here, the peripheral edge portion of the second placement area on the substrate 101 is a frame-like area which corresponds to the peripheral edge portion 211x of the main surface 211s of the second electronic component 210 to be placed on the second placement area. The reinforcement positions 104 are arranged on the frame-like area, at predetermined positions. The main surface of a typical CSP is rectangular. On the rectangular-shaped second electronic component, the reinforcement positions are preferably arranged such that they correspond to at least the four corners, or positions close thereto, of the rectangular shape.

Figure 4:
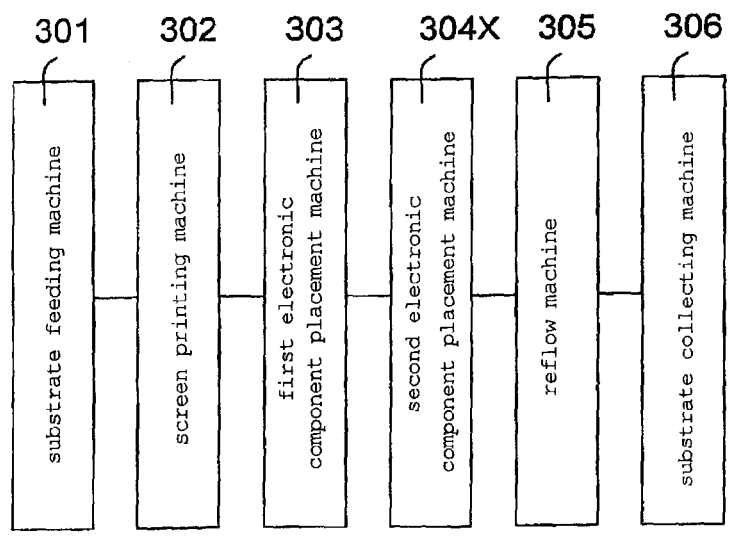
FIG. 4 is an explanatory diagram showing the overall configuration of an electronic component mounting line A according to one embodiment of the present invention.

Next, a description will be given on an example of how relevant machines are arranged on the electronic component mounting line of the present embodiment, with reference to drawings. FIG. 4 shows the arrangement of the machines, in its entirety, on the electronic component mounting line 300 according to the present embodiment.

The electronic component mounting line comprises machines that are linked to one another at their respective substrate carrying conveyors. The line enables a substrate to undergo solder paste printing, electronic component placements, reflow, etc. in this order, as the substrate is carried from upstream to downstream, by the substrate carrying conveyors that are linked to one another. The electronic component mounting line 300 comprises:

(i) a substrate feeding machine 301 for feeding the substrate 101 on which the electronic components are to be mounted;

(ii) a screen printing machine 302 for applying the solder paste to the pre-selected electrodes (first electrodes 102a) provided on the first placement area of the substrate 101 that has been fed by the substrate feeding machine 301;

(iii) a first electronic component placement machine 303 comprising a first placing head, for placing the first electronic component 200 on the first electrodes 102a to which the solder paste has been applied;

(iv) a second electronic component placement machine 304X comprising: a dispensing head for dispensing the reinforcing resin 105 onto the reinforcement positions 104 on the substrate 101; and a second placing head for placing the second electronic component 210 on the second placement area;

(v) a reflow machine 305 arranged to be after the second electronic component placement machine 304X, for solder bonding the first electronic component 200 and the second electronic component 210 to the substrate 101, by heating the substrate 101 to melt the solder thereon; and (vi) a substrate collecting machine 306.

Figure 5:
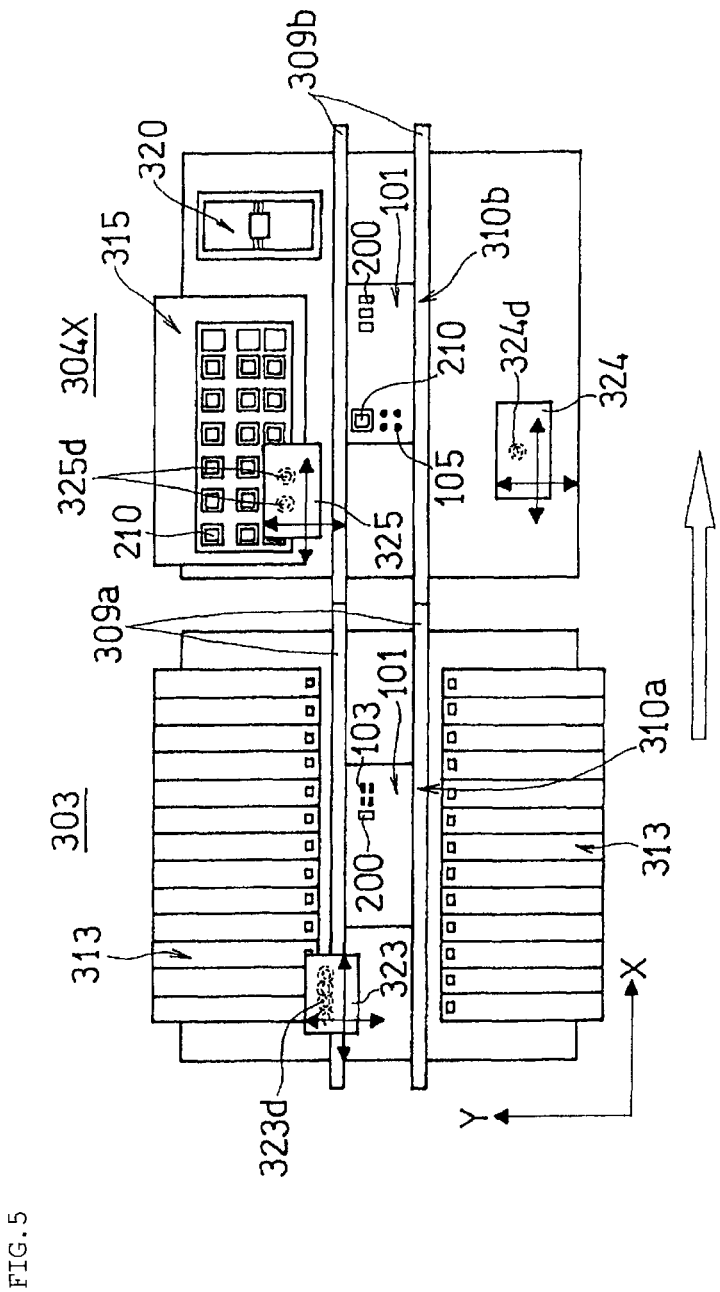
FIG. 5 is a top view of a part of the electronic component mounting line, the part having a configuration which includes a first electronic component placement machine and a second electronic component placement machine, linked in this order.

FIG. 5 is a top view of a part of the electronic component mounting line 300, the part having a configuration which includes the first electronic component placement machine 303 and the second electronic component placement machine 304X, linked in this order. As illustrated in FIG. 5, the first electronic component placement machine 303 and the second electronic component placement machine 304X form a line for carrying the substrate 101 that comes from the screen printing machine 302. This line is formed through the attachment of the substrate carrying conveyors 309a and 309b that are respectively provided on the corresponding machines 303 and 304X. The substrate carrying conveyors 309a and 309b serve to carry the substrate to specific working locations (substrate holders) within the respective machines 303 and 304X, and position it there where the electronic component placements and the resin dispensing are to be performed. Note that the arrow in FIG. 5 indicates the upstream-to-downstream direction in which the electronic component mounting line 300 runs.

The first electronic component placement machine 303 places the first electronic component 200 on the first electrodes 102a disposed on the substrate 101 that comes from the screen printing machine 302. The first electronic component placement machine 303 comprises: the substrate carrying conveyor 309a disposed in the middle; a first component feeding unit 313 disposed on both sides of the substrate carrying conveyor 309a; and the first placing head 323. The substrate carrying conveyor 309a comprises a substrate holder 310a which holds the substrate while it is worked on by the first placing head 323.

Arranged on the first component feeding unit 313, are tape feeders for feeding the first electronic component 200. The first placing head 323 is supported by an X-Y movement mechanism (not illustrated). This X-Y movement mechanism is controlled by a pre-selected control unit, and enables movements of the first placing head 323 to and from the first component feeding unit 313 and the substrate carrying conveyor 309a in the space thereabove.

The first placing head 323 comprises a suction nozzle 323d that moves up and down due to a built-in up-and-down movement mechanism. The placing head 323 picks up the first electronic component 200 from the first component feeding unit 313, by the suction nozzle 323d moving up/down and performing suction; and then, places the first electronic component 200 on the substrate 101, by the suction nozzle 323d moving up/down and performing suction release (vacuum break) from above the first placement area of the substrate 101.

The first placing head 323 places the connection terminal 201 of the first electronic component 200 on the substrate 101, such that it lands on the corresponding first electrode 102a to which the solder paste has been applied in advance.

The second electronic component placement machine 304X has the following functions: to dispense the reinforcing resin 105 on the substrate 101 that comes from the first electronic component placement machine 303, at the reinforcement positions 104 arranged on the peripheral edge portion of the second placement area which includes the second electrodes 102b; and to place the second electronic component, such that the peripheral edge portion thereof comes in contact with the reinforcing resin 105 that has been dispensed onto the reinforcement positions 104. That is, the second electronic component placement machine 304X is configured to perform the following steps in the given order: the step of dispensing the reinforcing resin 105 onto the reinforcement positions 104; and the step of placing the second electronic component 210 on the second placement area.

Specifically, the second electronic component placement machine 304X comprises: the substrate carrying conveyor 309b disposed in the middle; and the dispensing head 324 having a dispensing nozzle 324d for ejecting the reinforcing resin 105; a second component feeding unit 315; and the second placing head 325. The substrate carrying conveyor 309b comprises a substrate holder 310b which holds the substrate while it is worked on by the dispensing head 324 and the second placing head 325.

The dispensing head 324 is supported by an X-Y-Z movement mechanism (not illustrated). This X-Y-Z movement mechanism is controlled by a pre-selected control unit, and enables movements of the dispensing head 324 in a horizontal direction and up-and-down directions in the space above the substrate carrying conveyor 309b. The movements of the dispensing head 324, the ejection of the reinforcing resin 105 from the dispensing nozzle 324d, etc. are controlled by commands from the control unit.

The second component feeding unit 315 is a tray feeder, and arranged thereon are trays accommodating the second electronic components 210, respectively.

The second placing head 325 is supported by an X-Y movement mechanism (not illustrated). This X-Y movement mechanism is controlled by a pre-selected control unit, and enables movements of the second placing head 325 to and from the second component feeding unit 315 and the substrate carrying conveyor 309c in the space thereabove. The second placing head 325 comprises a suction nozzle 325d that moves up and down due to a built-in up-and-down movement mechanism. The second placing head 325 picks up the second electronic component 210 from the second component feeding unit 315, by the suction nozzle 325d moving up/down and performing suction; and then, places the second electronic component 210 on the substrate 101, by the suction nozzle 325d moving up/down and performing suction release (vacuum break) from above the second placement area of the substrate 101.

Figure 6A:
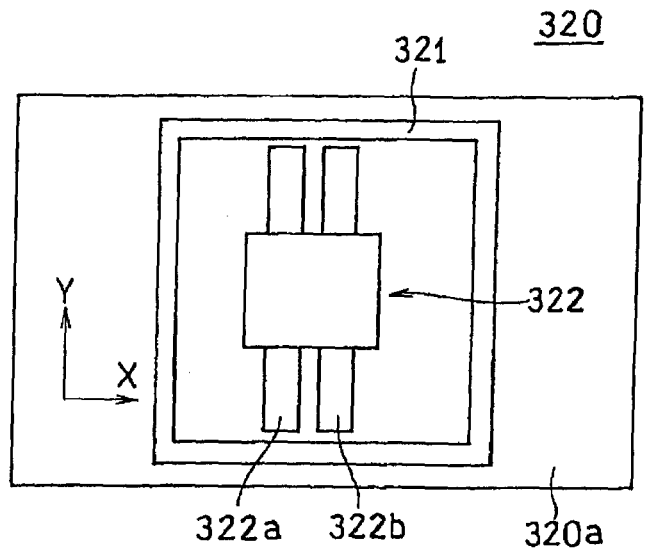
FIG. 6A is conceptual drawing of a transferring unit as seen from above, which is for forming a flux coating.
Figure 6B:
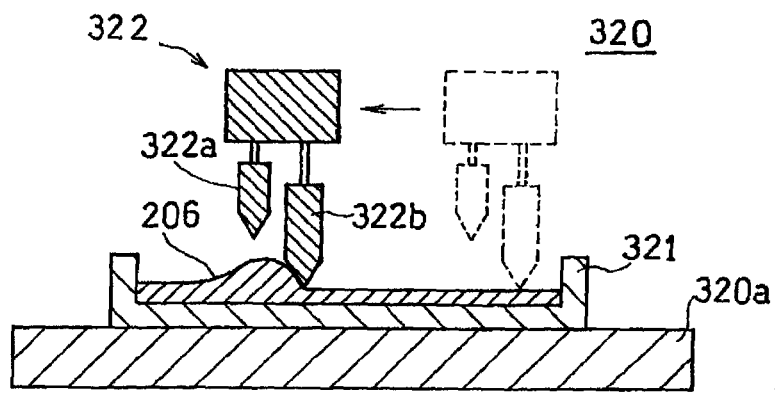
FIG. 6B is a conceptual drawing of the transferring unit of FIG. 6A in vertical section, showing how it operates when the flux coating is formed.

The second electronic component placement machine 304X may include a transferring unit 320 for providing a flux coating. The transferring unit 320 has a mechanism capable of providing the flux coating with a thickness suited for transferring the flux to the bumps 214 on the second electronic component 210. For example, as illustrated in FIG. 6A, the transferring unit 320 comprises: a base table 320a disposed at the bottom; a transferring table 321 disposed on the base table 320a; and a squeegee unit 322 disposed on the transferring table 321. The squeegee unit 322 comprises a first squeegee member 322a and a second squeegee member 322b, both with a length nearly equal to the length of the transferring table 321 in a Y-axis direction; and they are arranged in parallel to the Y-axis direction with a certain amount of space therebetween. The squeegee members can freely move up and down due to an up-and-down movement mechanism built in the squeegee unit 322. That is, they can move freely, to and fro, within the coating formed on the transferring table 321. As illustrated in FIG. 6B, the transferring unit 320 produces the flux coating by moving the squeegee units 322 in a relatively horizontal direction within the transferring table 321, so as to spread the flux on the transferring table 321 to obtain a thin layer thereof.

Figure 6C:
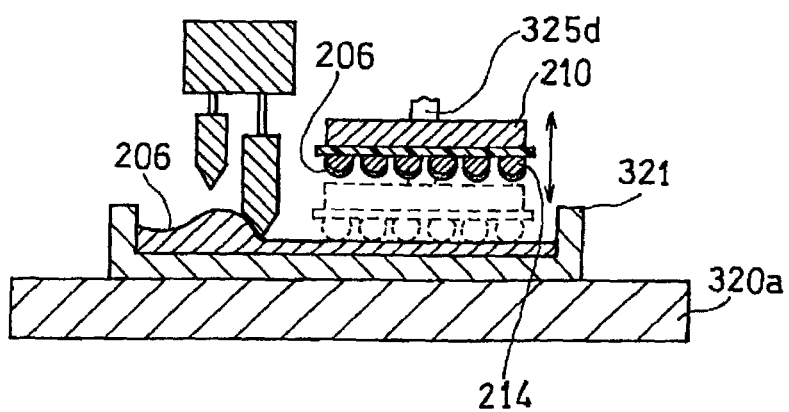
FIG. 6C is a conceptual drawing of the transferring unit of FIG. 6A in vertical section, showing when the solder bumps on the CSP are brought into contact with the flux coating, to transfer the flux to the solder bumps.

After picking up the second electronic component 210, the second placing head 325 moves to a position above the transferring unit 320; and as illustrated in FIG. 6C, makes the suction nozzle 325d move down and up so that the solder bumps 214 on the second electronic component 210 come in contact with the coating of the flux 206, thereby transferring the flux 206 to the solder bumps 214. Thereafter, the second placing head 325 moves to the second placement area of the substrate, and places the second electronic component 210 on the substrate 101, such that the solder bumps 214 land on the corresponding second electrodes 102b. Such movements of the second placing head 325 are controlled by commands from a pre-selected control unit.

Here, on the electronic component mounting line 300 of FIGS. 4 and 5, the first electronic component placement machine 303 is arranged upstream of the second electronic component placement machine 304X. However, the order in which the first electronic component placement machine 303 and the second electronic component placement machine 304X are arranged, is not limited to the above. That is, the first electronic component placement machine 303 may be arranged downstream of the second electronic component placement machine 304X. Moreover, the electronic component mounting line may comprise two or more of the first electronic component placement machines, and likewise, may comprise two or more of the second electronic component placement machines. Furthermore, these first electronic component placement machines and these second electronic component placement machines can be arranged in any order.

Next, a description will be given on the method for producing a substrate with electronic components mounted thereon, by utilizing the electronic component mounting line 300 of the present invention.

Figure 7:
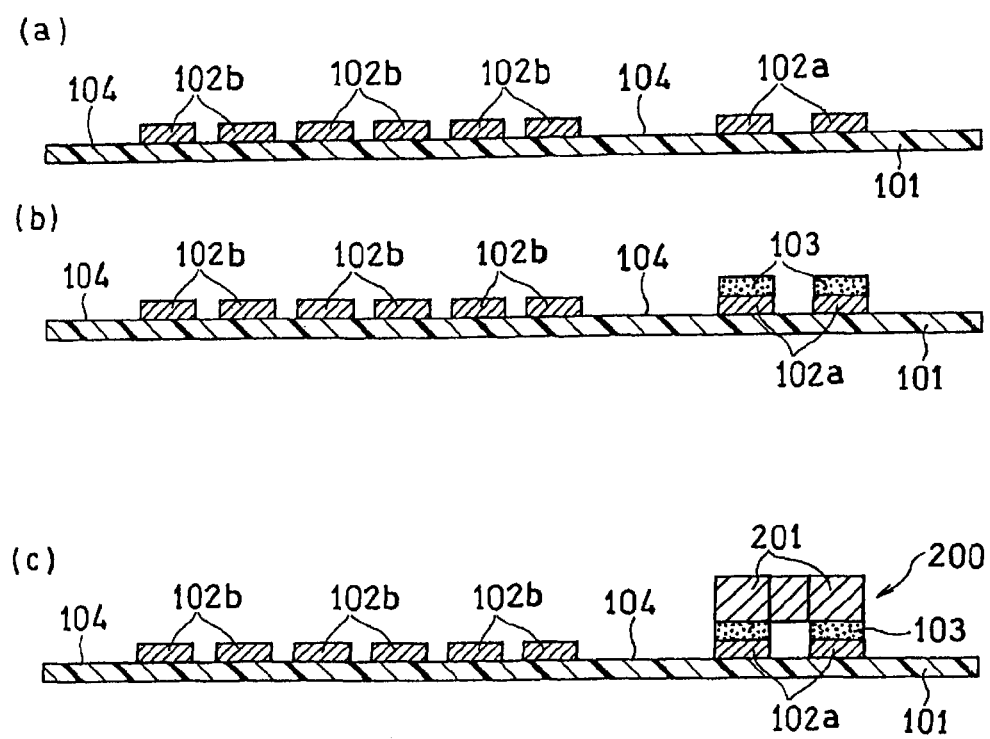
FIG. 7 is an explanatory drawing to explain the former process in an electronic component mounting method for the electronic component mounting line.
Figure 8:
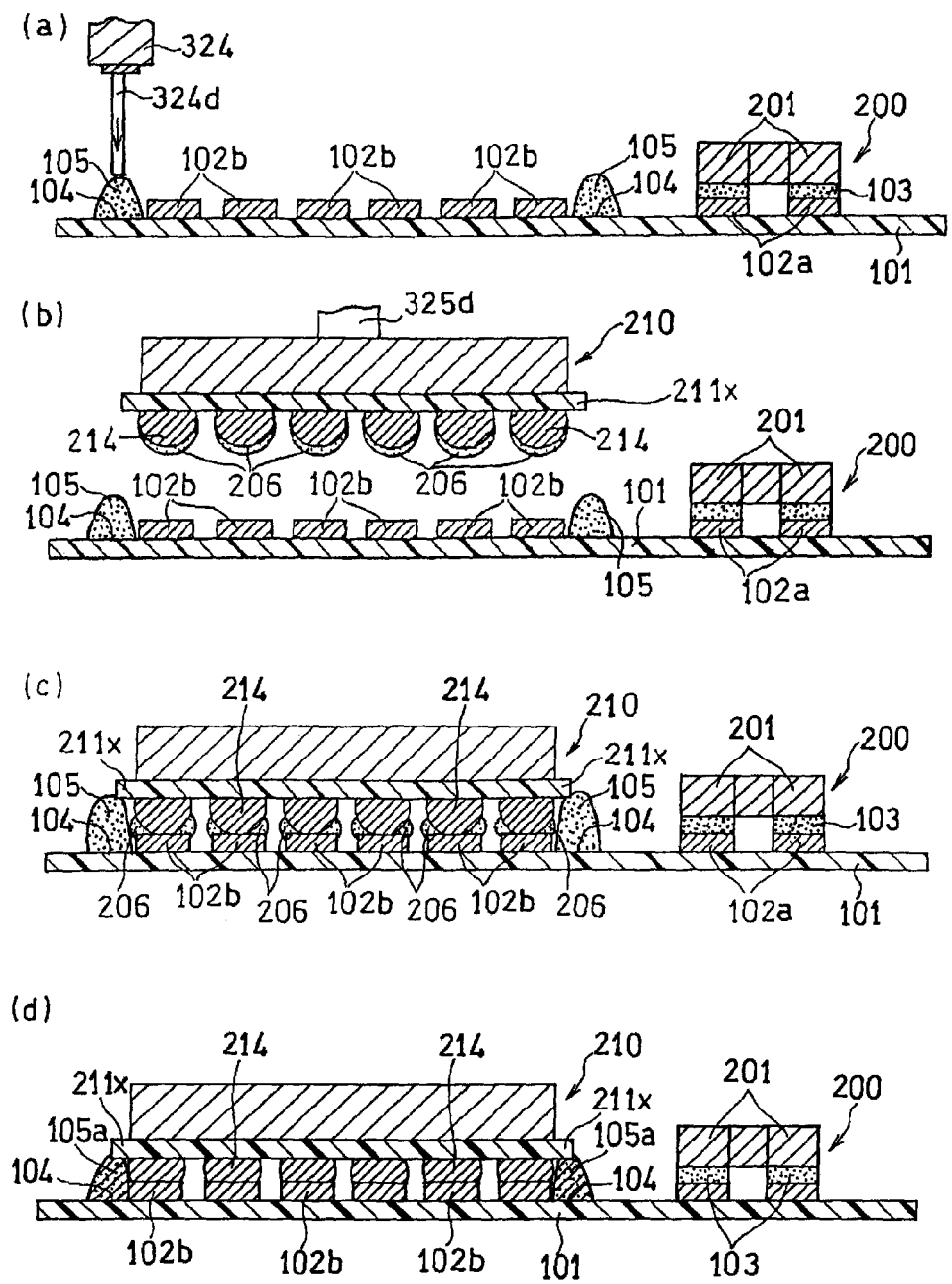
FIG. 8 is an explanatory drawing to explain the latter process in the electronic component mounting method for the electronic component mounting line.

According to FIGS. 7 and 8, first, the substrate 101 with no components placed thereon as illustrated in FIG. 7(a) is carried out of the substrate feeding machine 301 (step one), and is sent to the screen printing machine 302.

Next, the screen printing machine 302 performs the solder printing process (step two) in which the solder paste 103 is printed on the first electrodes 102a disposed on the substrate 101 (FIG. 7(b)). After completing printing of the solder paste, the screen printing machine 302 sends the substrate 101 to the first electronic component placement machine 303.

Next, as illustrated in FIG. 7(c), the first electronic component placement machine 303 performs a first electronic component placement process (step three) in which the first electronic component 200 is placed on the substrate 101. Specifically, the substrate carrying conveyor 309a carries the substrate 101 to a predetermined working location and positions it there; the suction nozzle 323d of the first placing head 323 holds by suction, the first electronic component 200 fed from the first component feeding unit 313; and then, the first placing head 323 moves in a horizontal direction to position the first electronic component 200 at the first placement area.

Next, the suction nozzle 323d moves up/down and releases the hold, so that the connection terminals 201 of the first electronic component 200 land on the solder paste that has been printed on the first electrodes 102a, thereby placing the first electronic component 200 on the substrate 101. After completing placement of the first electronic component, the first electronic component placement machine 303 drives the substrate carrying conveyor 309a and sends the substrate 101 to the second electronic component placement machine 304X.

Next, as illustrated in FIG. 8(a), the second electronic component placement machine 304X performs a resin dispensing process (step four) in which the reinforcing resin 105 is dispensed on the substrate 101, at the reinforcement positions 104 arranged on the peripheral edge portion of the second placement area intended for placement of the second electronic component 210. Specifically, the substrate carrying conveyor 309b carries the substrate 101 to the predetermined substrate holder 310b and positions it there; the dispensing head 324 moves in a horizontal direction and positions the dispensing nozzle 324d above the reinforcement position 104; and then, the dispensing nozzle 324d dispenses the reinforcing resin 105 onto the reinforcement position 104. The dispensing pattern of the reinforcing resin 105 is not particularly limited, and for example, is dispensed onto the reinforcement positions corresponding to the four corners of the rectangular-shaped second electronic component, which are on the peripheral edge portion thereof.

Figure 10:
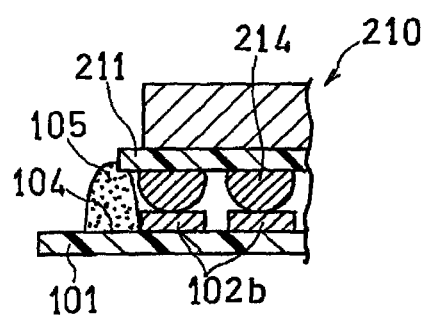
FIG. 10 is a drawing showing the second electronic component and a reinforcing resin in vertical section, to explain the relation between the two in terms of height.
Figure 10:
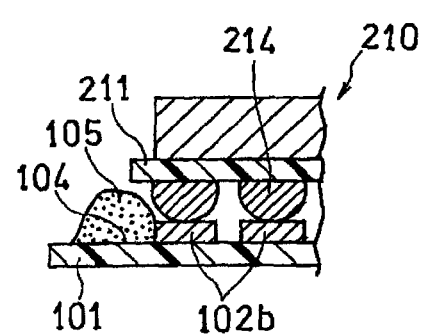

The reinforcing resin 105 is dispensed to have a height sufficient for the reinforcing resin 105 to come in contact with the inner substrate 211 which is a part of the package of the second electronic component 210 to be placed on the substrate 101 in a later process. That is, the viscosity and thixotropy of the reinforcing resin 105 are adjusted such that, as illustrated in FIG. 10(a), the height thereof is sufficient for the reinforcing resin 105 to reach the inner substrate 211 of the second electronic component 210, when the second electronic component 210 is placed on the substrate 101.

A thermosetting resin is used as the reinforcing resin. Examples of the thermosetting resin include epoxy resin, phenol resin, melamine resin, and urethane resin.

After completing dispensing of the reinforcing resin 105 onto all of the reinforcement positions 104, the second electronic component placement machine 304X goes on to perform the second electronic component placement process (step five) in which the second electronic component 210 is placed on the substrate 101, as illustrated in FIG. 8(b).

Specifically, the suction nozzle 325d of the second placing head 325 holds by suction, the second electronic component 210 fed from the second component feeding unit 315; the second placing head 325 moves in a horizontal direction and positions the second electronic component 210 above the transferring unit 320 which forms the flux coating; and then, the suction nozzle 325d moves up/down while maintaining the suction, so that the bumps 214 on the second electronic component 210 are brought into contact with the coating of the flux 206, thereby transferring the flux 206 to the bumps 214.

The flux 206 may be of any material as long as it is effective for removing oxides that are present on the electrode surfaces and bump surfaces at the time of solder bonding. The flux composition is not particularly limited, and for example, contains a base material such as rosin, an activator such as an organic acid or halide, a solvent, a thixotropy-promoting agent, etc. The flux may be a thermosetting flux containing a thermosetting resin component.

Subsequently, the placing head 325 moves in a horizontal direction and positions the second electronic component 210 at the second placement area; and then, as illustrated in FIG. 8(c), makes the bumps 214 on the second electronic component 210 that have been coated with the flux 206, to land on the corresponding second electrodes 102b.

Here, the reinforcing resin 105 starts to become fluid immediately after it is dispensed onto the reinforcement positions 104 by the second electronic component placement machine 304X. However, since the second electronic component 210 is placed by the second electronic component placement machine 304X also, the reinforcing resin 105 can come in contact with the peripheral edge portion 211x of the second electronic component 210, before greatly losing its shape. Moreover, after the reinforcing resin 105 is dispensed onto the reinforcement positions 104, the second electronic component is placed on the second placement area while the substrate 101 is held by the substrate holder 310b and not moved. Therefore, the reinforcing resin 105 does not lose its shape from vibration, etc. that occur when the substrate 101 is moved. Furthermore, by coming in contact with the second electronic component 210, the reinforcing resin 105 is able to have its fluidity suppressed. Therefore, the reinforcing resin 105 is less likely to come in contact with the solder paste that is on the first electrode 102a adjacent thereto; and is less likely to become the cause of poor bonding.

After completing placement of the second electronic component, the second electronic component placement machine 304X drives the substrate carrying conveyor 309b and sends the substrate 101 to the reflow machine 305.

Next, the reflow machine 305 performs a reflow process (step six) in which the substrate 101 is heated inside an oven to melt the solder thereon. In the reflow process, the substrate 101 on which the first electronic component 200 and the second electronic component 210 have been placed, is heated. Inside the reflow machine, the molten solder bumps and solder paste become wet and spread to the electrodes. Moreover, the reinforcing resin 105 cures, and as illustrated in FIG. 8(d), forms a resin-reinforced portion 105a. This results in obtaining a mounting structure in which the first electronic component 200 and the second electronic component 210 are bonded to the surface of the substrate 101, with the solder.

During the reflow process, the reinforcing resin 105 is in contact with the second electronic component, but is not in contact with the solder paste on the first electrode; and therefore, the first electronic component 200 and the second electronic component 210 are mounted on the substrate 101 in a satisfactory manner. Thereafter, the substrate 101 is carried out of the reflow machine 306, and is collected by the substrate collecting machine 307.

After completing placement of the first electronic component, a unit 304Y drives the substrate carrying conveyor 309c and sends the substrate 101 to the reflow machine 306.

FIGS. 7 and 8 are drawings to explain the case where the steps one to six are carried out in this order. However, note that the step three may be carried out after the step five. That is, the steps two, four, five, and three may be carried out in this order. In this case, the first electronic component placement machine 303 is arranged downstream of the second electronic component placement machine 304X, on the electronic component mounting line. Moreover, the combination of the steps four and five may be carried out two or more times. In this case, two or more of the second electronic component placement machines 304X may be arranged on the electronic component mounting line; and the steps four and five may be carried out repeatedly two or more times, by one of these second electrode component placement machines 304X.

Figure 9:
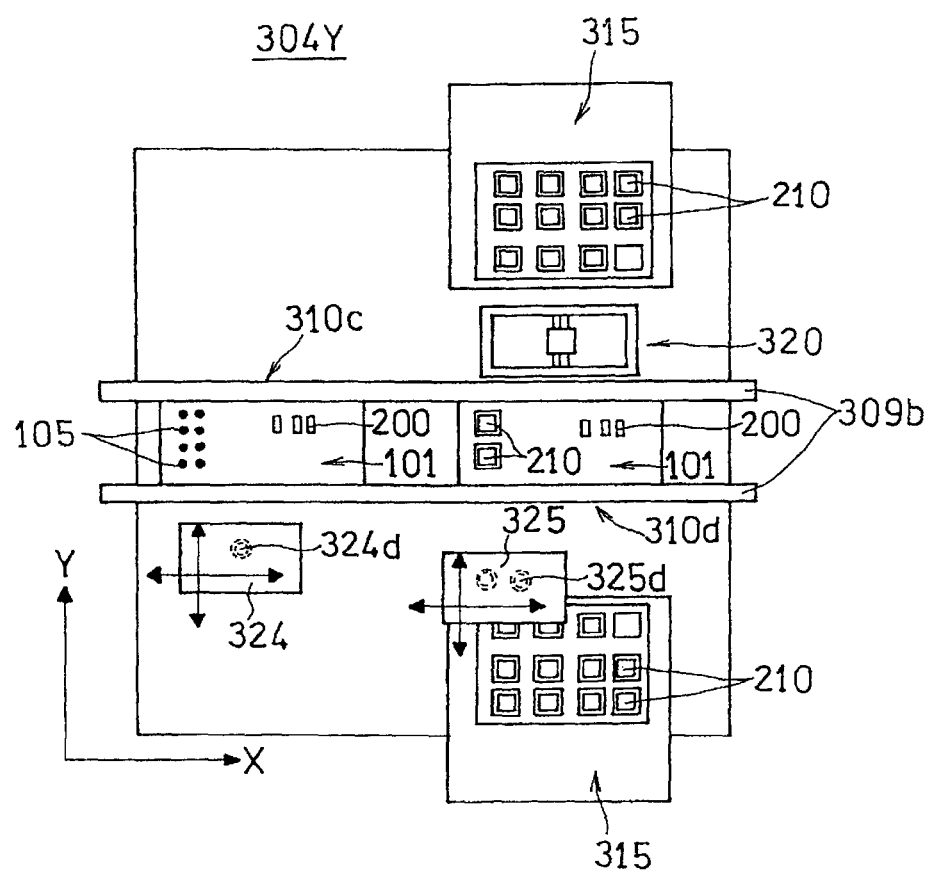
FIG. 9 is a top view of the second electronic component placement machine with a modified configuration.

Next, with reference to FIG. 9, a description will be given on the second electronic component placement machine 304Y which is a modification of the second electronic component placement machine 304X. In FIG. 9, elements having the same functions as those in FIG. 5, are given the same corresponding reference numerals as in FIG. 5.

The substrate carrying conveyor 309a, disposed in the middle of the second electronic component placement machine 304Y, comprises: an upstream-side substrate holder 310c which holds the substrate 101 while it is worked on by the dispensing head 324; and a downstream-side substrate holder 310d which holds the substrate 101 while it is worked on by the second placing head 325.

The dispensing head 324 moves in a horizontal direction and up-and-down directions in the space above the upstream-side substrate holder 310c, such movements enabled by an X-Y-Z movement mechanism that is controlled by a pre-selected control unit. On the other hand, the second placing head 325 moves to and from the second component feeding unit 315 and the downstream-side substrate holder 310d in the space thereabove, such movements enabled by an X-Y movement mechanism that is controlled by a pre-selected control unit. That is, the dispensing head 324 and the second placing head 325 share the space above the substrate carrying conveyor 309b of the same second electronic component placement machine. As such, the second electronic component placement machine 304Y is configured to allow the dispensing head 324 to move in the space on the upstream side, and the second placing head 325 to move in the space on the downstream side.

At the upstream-side substrate holder 310c, the dispensing head 324 dispenses the thermosetting resin 105 onto the reinforcement positions 104 on the substrate 101. After work at the upstream-side substrate holder 310c is finished, the substrate 101 is carried on the substrate carrying conveyor 309b and sent to the downstream-side substrate holder 310d that is disposed within the same second electronic component placement machine. Then, the second placing head 325 places the second electronic component 210 on the second placement area of the substrate 101 held by the downstream-side substrate holder 310d.

Since the second electronic component placement machine 304Y is capable of placing the second electronic component 210 on the second placement area of another substrate 101 held by the downstream-side substrate holder 310d, while dispensing the reinforcing resin 105 onto the reinforcement positions 104 on the substrate 101 held by the upstream-side substrate holder 310c, the steps four and five that were described with reference to FIG. 8, can be carried out together. Therefore, compared to the second electronic component placement machine X that was described with reference to FIG. 5, there is more improvement in work efficiency when producing a substrate with electronic components mounted thereon.

The configuration of the electronic component mounting line of the present invention is not limited to the foregoing embodiment, and can be changed as appropriate. For example, a test machine may be arranged between the screen printing machine and the first electronic component placement machine or the second electronic component placement machine 304X; between the screen printing machine and the second electronic component placement machine 304Y; and/or between the reflow machine and the substrate collecting machine. Alternatively, in addition to the second electronic component placement machine including the dispensing head, an adhesive dispensing machine for dispensing an adhesive for temporary bonding of various electronic components, may be arranged between the screen printing machine and the second electronic component placement machine 304X; between the screen printing machine and the second electronic component placement machine 304Y; and/or downstream of the first electronic component placement machine.

Alternatively, as already mentioned in the foregoing, the electronic component mounting line may be configured to include two or more of the first electronic component placement machines, or may be configured to include two or more of the second electronic component placement machines. The second electronic component placement machines 304X and 304Y may be used together in a combination.

The second electronic component placement machine may be a multipurpose-type machine which has a function to dispense, in addition to the reinforcing resin, an adhesive for temporary bonding as well as other kinds of adhesives and resins.

The first electronic component placement machine may be a multipurpose-type machine having a function to place electronic components other than the first electronic component. Likewise, the second electronic component placement machine may be a multipurpose-type machine having a function to place electronic components other than the second electronic component. That is, there are no particular limitations to the kinds of machines used as the first electronic component placement machine and the second electronic component placement machine, as long as they function as intended when arranged on the electronic component mounting line.

INDUSTRIAL APPLICABILITY

According to the electronic component mounting line of the present invention and the electronic component placement machines in the present invention, it is possible to suppress poor bonding at portions bonded by solder bumps, such poor bonding caused by thermosetting resin, provided as reinforcing resin, losing its shape over time and thus spreading or deforming. Thus, the present invention is useful in the field of surface mounting, in which pluralities of CSPs and chip components are mounted on the same substrate.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

EXPLANATION OF REFERENCE NUMERALS

101: substrate (printed circuit board)
102a: first electrode
102b: second electrode
103: solder paste
104: reinforcement position
105: reinforcing resin
200: first electronic component
201: connection terminal
210: second electronic component
211: inner substrate
211s: main surface
211x: peripheral edge portion
212: semiconductor device
213: sealing resin
214: bump
300: electronic component mounting line
301: substrate feeding machine
302: screen printing machine
303: first electronic component placement machine
304X, 304Y: second electronic component placement machine
305: reflow machine
306: substrate collecting machine
309a, 309b: substrate carrying conveyor
310a, 310b, 310c, 310d: substrate holder
313: first component feeding unit
315: second component feeding unit
323: first placing head
323d: suction nozzle
324: dispensing head
324d: dispensing nozzle
325: second placing head
325d: suction nozzle
320: transferring unit
320a: base table
321: transferring table
322: squeegee unit
322a: first squeegee member
322b: second squeegee member

The invention claimed is:

1. An electronic component mounting method in which a first electronic component and a second electronic component are mounted on a substrate that is being moved from upstream to downstream on an electronic component mounting line, the first electronic component having connection terminals for solder paste connection, the second component having solder bumps, the method comprising:
a first step of preparing the substrate including: a first placement area having first electrodes for connection to the connection terminals; and a second placement area having second electrodes for connection to the solder bumps;
a second step of applying a solder paste to the first electrodes, by using a screen printing machine arranged on the electronic component mounting line;
a third step of placing the first electronic component on the substrate such that the connection terminals land on the solder paste on the corresponding first electrodes;
a fourth step of dispensing a thermosetting resin onto at least one reinforcement position arranged on a peripheral edge portion of the second placement area;
a fifth step of placing the second electronic component on the substrate such that the solder bumps land on the corresponding second electrodes; and bringing the thermosetting resin that has been applied to the reinforcement position, in contact with a peripheral edge portion of the second electronic component; and
a sixth step of bonding the first and second electronic components to the substrate by heating the substrate on which the first and second electronic components have been placed, to melt the solder paste and the solder bumps and to cure the thermosetting resin, by using a reflow machine arranged on the electronic component mounting line; and then cooling the substrate,
the third step being performed by a first electronic component placement machine arranged on the electronic component mounting line; and the fourth and fifth steps being performed in recited order, by a second electronic component placement machine comprising a dispensing head for dispensing the thermosetting resin and a placing head for placing the second electronic component.

2. The electronic component mounting method in accordance with claim 1,
wherein the second electronic component placement machine has an upstream-side substrate holder and a downstream-side substrate holder,
in the fourth step, the thermosetting resin is dispensed onto the reinforcement position on the substrate held by the upstream-side substrate holder, and
in the fifth step, the second electronic component is placed on the second placement area of the substrate that has been moved from the upstream-side substrate holder to the downstream-side substrate holder and is held by the downstream-side substrate holder.

3. The electronic component mounting method in accordance with claim 2,
wherein the fourth step as well as the fifth step are performed, such that, while the thermosetting resin is being dispensed onto the reinforcement position on the substrate held by the upstream-side substrate holder, the second electronic component is placed on the second placement area of another substrate held by the downstream-side substrate holder.

4. The electronic component mounting method in accordance with claim 1,
wherein the second electronic component placement machine has a transferring unit for forming a flux coating, and
in the fifth step, before placement of the second electronic component on the second placement area, the solder bumps on the second electronic component are brought in contact with the flux coating, to transfer the flux to the solder bumps.

5. An electronic component mounting line on which a substrate undergoes solder paste printing, electronic component placements, and reflow in recited order, while being moved from upstream to downstream, the line comprising:
a substrate feeding machine for feeding the substrate having a first placement area for placement of a first electronic component with a solder paste between the area and the component, and a second placement area for placement of a second electronic component having solder bumps;

a screen printing machine for applying the solder paste to the first placement area of the substrate that has been fed by the substrate feeding machine;

a first electronic component placement machine for placing the first electronic component on the first placement area of the substrate to which the solder paste has been applied;

a second electronic component placement machine comprising: a dispensing head for dispensing a thermosetting resin onto at least one reinforcement position arranged on a peripheral edge portion of the second placement area of the substrate; and a placing head for placing the second electronic component on the second placement area of the substrate; and a reflow machine for bonding the first and second electronic components to the substrate, by heating the substrate on which the first and second electronic components have been placed, to melt the solder paste and the solder bumps and to cure the thermosetting resin; and then cooling the substrate, the second electronic component placement machine, after dispensing the thermosetting resin onto the reinforcement position, places the second electronic component such that a peripheral edge portion of the second electronic component comes in contact with the thermosetting resin that has been dispensed onto the reinforcement position.

6. The electronic component mounting line in accordance with claim 5, wherein the second electronic component placement machine has an upstream-side substrate holder and a downstream-side substrate holder, the substrate is held by the upstream-side substrate holder as the thermosetting resin is dispensed onto the reinforcement position, and is then moved to the downstream-side substrate holder, and the substrate is held by the downstream-side substrate holder as the second electronic component is placed on the second placement area.

7. The electronic component mounting line in accordance with claim 6, wherein the second electronic component placement machine, while dispensing the thermosetting resin onto the reinforcement position on the substrate held by the upstream-side substrate holder, also places the second electronic component on the second placement area of another substrate held by the downstream-side substrate holder.

8. The electronic component mounting line in accordance with claim 5, wherein the second electronic component placement machine has a transferring unit for forming a flux coating, and, before placing the second electronic component on the second placement area, brings the flux coating in contact with the solder bumps on the second electronic component, to transfer the flux to the solder bumps.

* * * * *